(12) United States Patent
Chu et al.

(10) Patent No.: US 6,291,307 B1
(45) Date of Patent: Sep. 18, 2001

(54) METHOD AND STRUCTURE TO MAKE PLANAR ANALOG CAPACITOR ON THE TOP OF A STI STRUCTURE

(75) Inventors: Shao-Fu Sanford Chu; Yang Pan; Wang Yimin; Kai Shao, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/368,863

(22) Filed: Aug. 6, 1999

(51) Int. Cl.[7] ............................................. H01L 21/20
(52) U.S. Cl. ................................................... 438/393
(58) Field of Search .................................... 438/238, 393, 438/394, 324

(56) References Cited

U.S. PATENT DOCUMENTS

| | | | |
|---|---|---|---|
| 5,173,437 | 12/1992 | Chi | 437/60 |
| 5,518,950 | 5/1996 | Ibok et al. | 437/67 |
| 5,571,746 | 11/1996 | Pan | 437/60 |
| 5,631,188 | 5/1997 | Chang et al. | 438/253 |
| 5,670,410 | 9/1997 | Pan | 437/60 |
| 5,891,771 | * 4/1999 | Wu et al. | 438/248 |
| 5,973,346 | 10/1999 | Pan | 257/303 |
| 6,022,781 | * 2/2000 | Noble, Jr. et al. | 438/296 |
| 6,087,214 | * 7/2000 | Cunningham | 438/244 |
| 6,103,592 | * 8/2000 | Levy et al. | 438/424 |

FOREIGN PATENT DOCUMENTS

| | | | |
|---|---|---|---|
| 0814499 | 6/1997 | (EP) | H01L/21/3205 |
| 0844660 | 11/1997 | (EP) | H01L/21/762 |
| 0966040 | 6/1998 | (EP) | H01L/23/64 |
| 9849722 | 4/1998 | (WO) | H01L/21/3205 |

OTHER PUBLICATIONS

P.C. Fazan et al., "A Highly Manufacturable Trench Isolation Process for Deep Submicron DRAMS's", Proceedings of the International Electronic Device Meeting 1993, pp. 3.6.1–3.6.4.

* cited by examiner

Primary Examiner—Long Pham
Assistant Examiner—William David Coleman
(74) Attorney, Agent, or Firm—George O. Saile; Rosemary L.S. Pike

(57) ABSTRACT

A new method is provided to create a capacitor over the surface of STI regions. The STI regions are first created in the surface of the substrate, a layer of sacrificial oxide is next blanket deposited over the substrate (thereby including the surface of the created STI regions). A depletion stop region overlying densely spaced STI regions is formed in the surface of the substrate by N+ ion implantation, N-well and P-well regions are formed surrounding the depletion stop region. An insulation layer is deposited. The sacrificial oxide and insulation layers are patterned and etched leaving the sacrificial oxide and the insulation layer in place where the capacitor is to be created. A layer of gate oxide is formed over the surface of the substrate, a layer of poly 2 is deposited for the bottom plate and the gate electrode. The conductivity of the gate electrode and the bottom plate of the capacitor is established by performing a selective N+ implant into the layer of poly 2 where the gate electrode and the bottom plate of the capacitor are to be formed. A layer of dielectric is deposited for the capacitor dielectric, a layer of in-situ doped poly 3 is deposited for the top plate of the capacitor. The layers of poly 3, dielectric and poly 2 are etched forming the capacitor structure and the gate electrode structure.

19 Claims, 5 Drawing Sheets

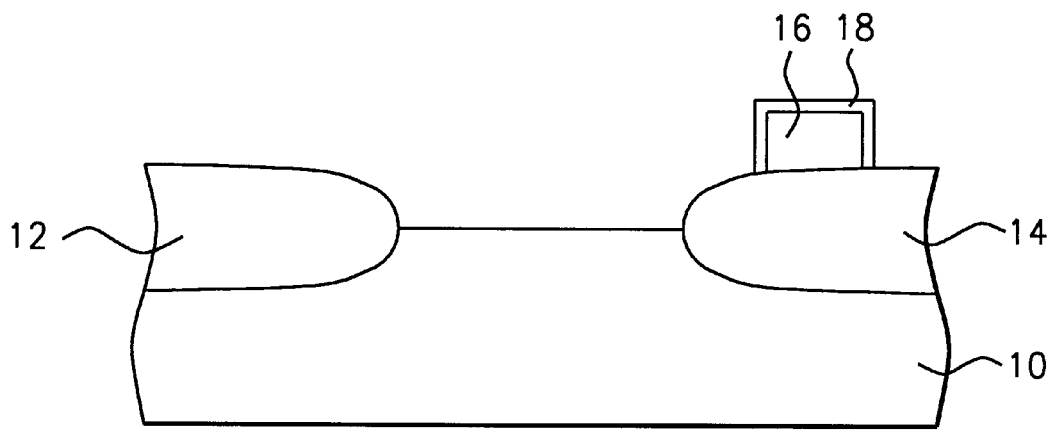
*FIG. 1a — Prior Art*
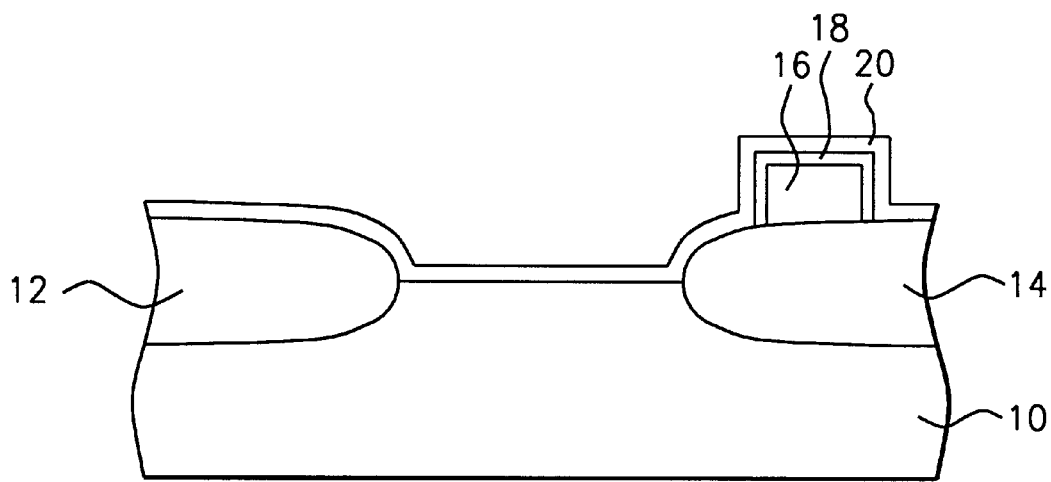
*FIG. 1b — Prior Art*

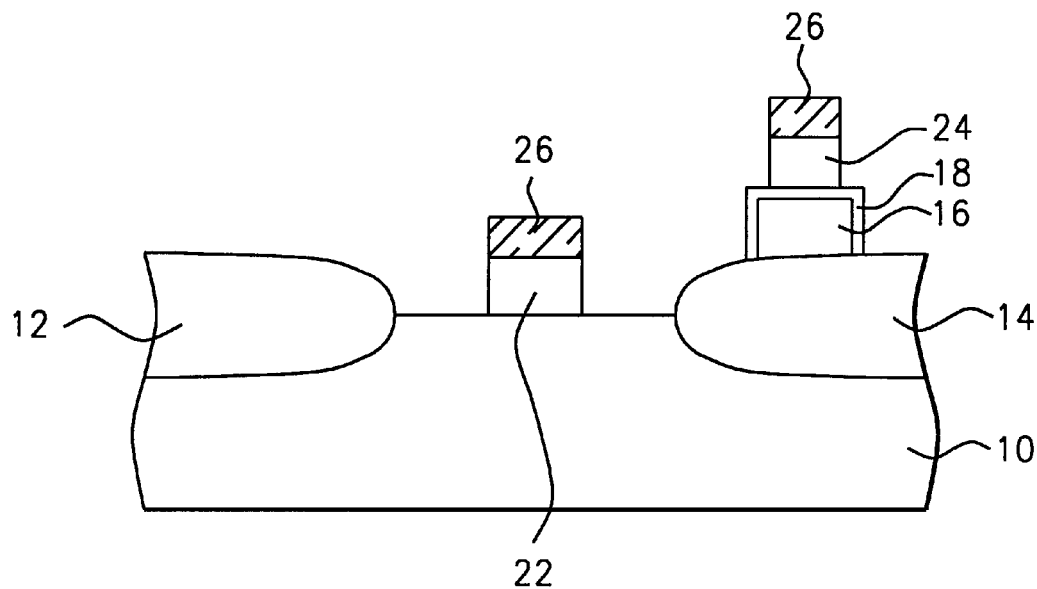
FIG. 1c – Prior Art
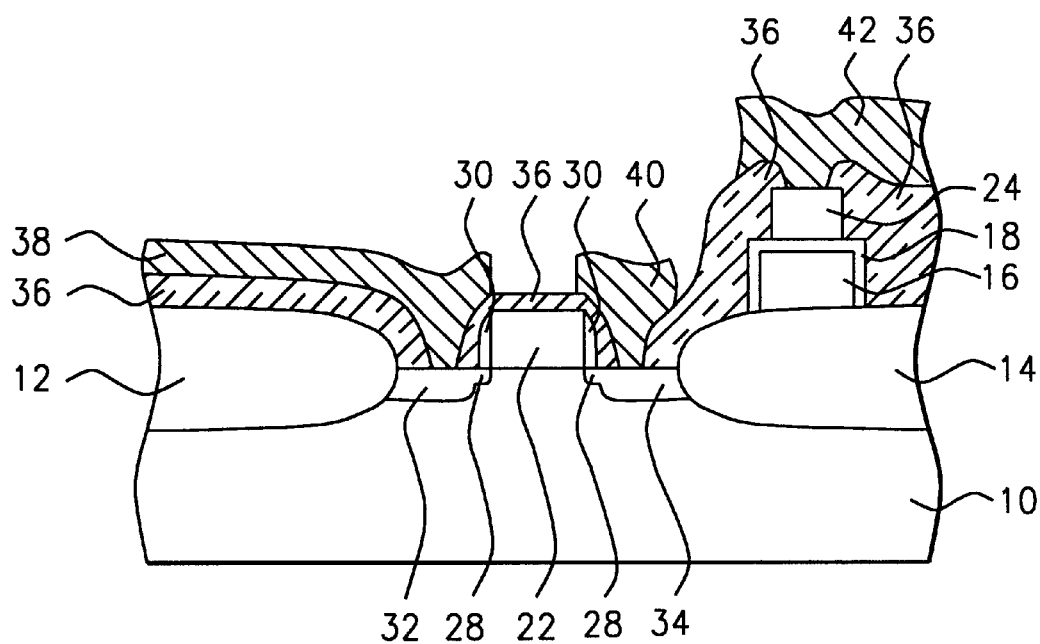
FIG. 1d – Prior Art

METHOD AND STRUCTURE TO MAKE PLANAR ANALOG CAPACITOR ON THE TOP OF A STI STRUCTURE

BACKGROUND OF THE INVENTION (1) Field of the Invention

The invention relates to the fabrication of integrated circuit devices, and more particularly, to a method for creating an analog capacitor on the surface of a Field Oxide isolation region.

(2) Description of the Prior Art

The manufacturing of semiconductor devices is an amalgam of the creation of a variety of components that collectively perform functions of data manipulation (logic functions) and of data retention (storage functions). The vast majority of these functions operates in a digital or one-off mode and as such recognizes zero and one conditions within the operational levels of the circuits. There are, in addition, applications that make use of analog levels of voltage where the voltage may have a spectrum of values between a high limit and a low limit. There are furthermore applications where both the digital and the analog methods of signal processing reside side by side in the same semiconductor device.

This mixture of functions and processing capabilities brings with it a mixture of components that can coexist within one semiconductor device. Where the vast majority of device components is made up of transistors, gate electrodes and a variety of switching components that address logic processing functions, it is not uncommon to also see resistors and capacitors that form part of a semiconductor device. It is for instance known that capacitors form a basic component of many analog circuits that are used for analog applications such as switched capacitor filters. It is also well known in the art that capacitors are widely applied in digital applications such as the storage node for Dynamic Random Access Memory (DRAM) circuits. This ability of capacitors to function in either the digital or the analog mode is referred to as the mixed mode application of the capacitor.

A resistive load is one of the components that is required for, for instance, Static Random Access Memory (SRAM) devices. A resistive load component can, in its simplest form, be created by sandwiching a lightly doped layer of polysilicon between two points of electrical contact. To the points of electrical contact can be connected for instance metal or polysilicon interconnect lines or interconnect lines that are created by N+ diffusion thereby forming low resistance interconnect lines. The sandwiched layer of poly serves as a resistor, which typically has a high resistive value. The resistive value depends on the level of doping that is applied to the layer of poly and by the geometric configuration (cross section) of the resistor. Where the resistor load is applied to the SRAM, the resistor must make electrical contact with the gate electrode and the drain region of the pull-down transistor as well as to the metal line to pass gate transistor. A resistor tab that makes contact with the gate and the drain regions can be created by depositing dopants at the interfaces between these regions and the resistive load. The resistive load is typically interconnected to its surrounding components by means of a high dope implant on either side of the resistor for which a doping mask is used.

As already indicated, capacitors form an important part of a number of semiconductor circuit designs. Where a capacitor is used as a functional component of an analog integrated circuit (IC), the capacitor is used to assure functionality of the analog circuit. Where a capacitor is used as a functional component of a digital integrated circuit, the capacitor is used to provide charge storage locations for individual bits of digital data that are stored within the digital IC.

One of the first processing steps that is required in creating semiconductor components on the surface of a substrate is to electrically isolate the active regions (the regions where the devices will be created) on the substrate surface. For this purpose, Field Oxide (FOX) isolation regions can be used to isolate discrete devices, such as for instance Field Effect Transistors (FET's), in Ultra Large Scale Integrated (ULSI) circuits on semiconductor chips. Another conventional approach in the semiconductor industry for forming field isolation is by the Local Oxidation of Silicon (LOCOS) method. LOCOS uses a patterned silicon nitride ($Si_3N_4$) as an oxidation barrier mask, the underlying silicon substrate is selectively oxidized to form the semi-planar isolation. However, this method requires long oxidation times (a large thermal budget) while lateral oxidation under the barrier mask limits the minimum spacing between adjacent active device areas. This prevents further increasing of the device packaging density.

One method of circumventing the LOCOS limitations and to further reduce the field oxide (FOX) minimum feature size is to allow shallow trench isolation (STI). One method of making STI is to first etch trenches having essentially vertical sidewalls in the silicon substrate. The trenches are then filled with a CVD of silicon oxide ($SiO_2$) and the $SiO_2$ is then plasma etched back or polished back using CMP, to form the STI isolation region. However, there are several problems associated with the conventional or prior art shallow trench isolation techniques. For example, if the silicon oxide is etched or polished to the substrate surface, dishing can occur resulting in a concave surface of the CVD silicon oxide in the trenches. Unfortunately, this results in recesses in the field oxide at the edge of the device areas. Later, when the gate electrodes are made for the FET's extending over the device area edge, this results in an undesirable lower and variable threshold voltage when the devices are completed. Therefore it is desirable to make FOX areas that extend higher than the substrate surface to avoid this problem while reducing manufacturing costs.

FIG. 1 shows a Prior Art processing sequence that is used to create an integrated circuit that contains a number of Field Effect Transistors (FET's) and a capacitor. FIG. 1a shows a monocrystalline silicon semiconductor substrate 10 into which two FOX regions 12 and 14 have been created. A layer 16 of for instance poly 1 is blanket deposited over the surfaces and patterned by lithography and etching techniques to leave the poly 1 layer 16 as the bottom plate for the capacitor on the surface of the recessed isolation region 14. An interpoly layer 18 composed of for instance silicon oxide or tetraethylorthosilicate (TEOS) are deposited and patterned by lithography and etching techniques to give the structure as shown in FIG. 1a. Layer 16 forms the bottom plate for the capacitor; layer 18 forms the capacitor dielectric. FIG. 1b shows the blanket deposition of a layer 20 of for instance poly 2 over the surface of the components. Lithography and etching of layer 20 is accomplished by the formation of resist masking of layer 22 as shown in FIG. 1c. The etching leaves the top plate 24 for the capacitor and the gate electrode 22 of the field effect transistor in place. The layers 26 of photoresist are removed by the conventional process of ashing.

FIG. 1d shows the completion of the structure by first implanting the self-aligned Lightly Doped diffusion (LDD) regions 28 adjacent to the gate electrode structure 22, by forming the gate spacers 30, by creating the (heavily doped)

source and drain regions 32 and 34 respectively for the gate electrode 22, the blanket deposition and subsequent patterning and etching of the passivation layer 36 and the establishment of metal contacts 38 (to the source region of the gate electrode 22), 40 (to the drain region of the gate electrode 22) and 42 (to the top plate of the capacitor).

It has already been pointed out that, when the Shallow Trench Isolation (STI) method of active device isolation is used, a field oxide regions is typically not flat due to the dishing effects that occur during the planarization, using Chemical Mechanical Polishing (CMP) techniques, of the field oxide layer. This results in difficulties in creating the capacitor on the surface of the field oxide region and in difficulties in controlling the exact design parameters of the capacitor, a phenomenon that is further aggravated by the subsequent curing of the field oxide.

In a number of analog designs, it is required that two or more matching capacitors are created whereby the capacitive values of the two (or more) capacitors are closely matched. The curving of the surface on which these capacitors are created makes exact control of the capacitor dimensions and the resulting performance parameters very difficult to accomplish. This is another reason as to why it is important to have a method that provides for exact control of the physical environment in which the capacitors are created.

The invention addresses a method to create a planar and high precision capacitor on the surface of the STI field isolation region.

U.S. Pat. No. 5,670,410 (Pan) shows a method for an analog capacitor on a FOX using a CMP step.

U.S. Pat. No. 5,571,746 (Pan) shows an analog capacitor formed on the ILD layer.

U.S. Pat. No. 5,631,188 (Chang et al.) discloses a low V poly capacitor.

U.S. Pat. No. 5,173,437 (Chi) shows a double poly capacitor.

SUMMARY OF THE INVENTION

A principle objective of the invention is to provide a method for the creation of a high precision analog capacitor on the surface of a STI field oxide region.

Another objective of the invention is to eliminate the impact of poor planarity of the surface of the STI field oxide region when creating an analog capacitor on this surface.

Yet another objective of the invention is to provide a method to create capacitors on the surface of STI regions that have closely matched physical and electrical characteristics.

In accordance with the objectives of the invention a new method is provided to create a capacitor over the surface of STI regions. The STI regions are first created in the surface of the substrate, a layer of sacrificial oxide is next blanket deposited over the substrate (thereby including the surface of the created STI regions). A depletion stop region overlying densely spaced STI regions is formed in the surface of the substrate by N+ ion implantation, N-well and P-well regions are formed surrounding the depletion stop region. An insulation layer is deposited. The sacrificial oxide and insulation layers are patterned and etched leaving the sacrificial oxide and the insulation layer in place where the capacitor is to be created. A layer of gate oxide is formed over the surface of the substrate, a layer of poly 2 is deposited for the bottom plate and the gate electrode. The conductivity of the gate electrode is established by performing an selective N+ implant into the layer of poly 2 where the gate electrode is to be formed. A layer of dielectric is deposited for the capacitor dielectric, a layer of in-situ doped poly 3 is deposited for the top plate of the capacitor. The layers of poly 3, dielectric and poly 2 are etched forming the capacitor structure and the gate electrode structure.

BRIEF DESCRIPTION OF THE DRAWINGS

FIGS. 1a and 1b show a cross section of a Prior Art Field Effect Transistor with a capacitive component, as follows:

FIG. 1a shows a cross section of a substrate with Prior Art field isolation regions after the formation of the bottom plate and dielectric of a capacitor over one of the field isolation regions.

FIG. 1b shows a cross section of a Prior Art process after a layer of polysilicon has been deposited for the formation of the gate electrode and the top plate of the capacitor.

FIG. 1c shows a cross section of a Prior Art process after the gate electrode and the capacitor top plate have been patterned and etched including the patterned layer of photoresist used for this etch.

FIG. 1d shows the completed Prior Art structure of gate electrode and capacitor with metal contacts in place.

DESCRIPTION OF THE PREFERRED EMBODIMENTS

Figure 2:
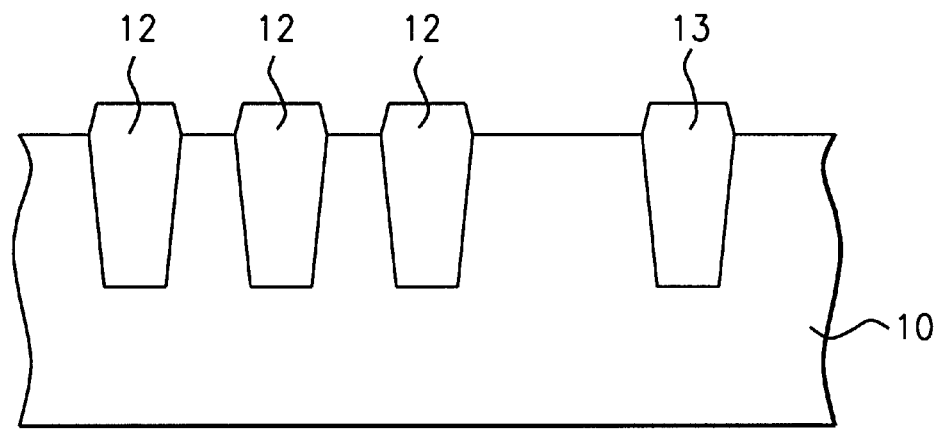
FIG. 2 shows a cross section of a substrate with Shallow Trench Isolation regions (STI's) formed therein.

Referring now specifically to FIG. 2, there is shown a cross section of a substrate 10 with Shallow Trench Isolation regions 12 and 13 formed therein. Substrate 10 is a (100) monocrystalline silicon having been lightly doped to a P-type polarity. It is to be noted that the STI regions are divided into two distinct groups, that is one group wherein the STI regions are closely spaced and another group that contains one STI region 13 whereby this region 13 is separated from the closely spaced STI regions 12 by a measurable distance. The reason for the close spacing of STI regions 12 is that the combined surface of these STI regions 12 serves as a support platform over which the capacitor will be created. The reason for the separation between the closely spaced STI regions 12 and the STI region 13 is that the substrate surface area created by this separation can be used for the creation of a gate electrode.

The p-type doping of the silicon substrate can be accomplished using boron as dopant at a dosage of between about 1E12 to 5E13 atoms/cm$^2$ and an energy of between about 5 to 40 KeV. The doping of the silicon can also be accomplished using indium as dopant at a dosage of between about 1E12 to 1E14 atoms/cm$^2$ and an energy of between about 50 to 250 KeV.

STI's can, as already has been pointed out, be made using a variety of methods. For instance, one method is the Buried Oxide (BOX) isolation used for shallow trenches. The method involves filling the trenches with a chemical vapor deposition (CVD) silicon oxide (SiO$_2$) and then etched back or CMP (Chemical Mechanical Polishing) polished to yield a planar surface. The shallow trenches etched for the BOX process are anisotropically plasma etched into the silicon substrate and are typically between 0.5 and 0.8 micrometer (um.) deep. STI are formed around the active device to a depth between 4000 and 20000 Angstrom.

Another approach in forming STI's is to deposit silicon nitride on thermally grown oxide. After deposition of the nitride, a shallow trench is etched into the substrate using a mask. A layer of oxide is then deposited into the trench so that the trench forms an area of insulate dielectric which acts to isolate the devices in a chip and thus reduce the cross talk between active devices. The excess deposited oxide must be polished of and the trench planarized to prepare for the next level of metalization. The silicon nitride is provided to the silicon to prevent polishing of the masked silicon oxide of the device FIG. 3 shows a cross section after the growth of a layer of sacrificial oxide, a selective implant of dopants has been performed in the STI regions (to form depletion stops) and after n-well and p-well regions have been formed is the surface of the substrate.

The layer 14 of sacrificial oxide is first grown over the surface of the substrate using LPCVD, PECVD, or APCVD processing, in a steam oxygen ambient, at a temperature between about 400 to 800 degrees C. to a thickness between about 1000 to 3000 Angstrom.

Following the creation of the layer 14 of sacrificial oxide, the implant mask 24 is used to perform implant 20 in the regions where the closely spaced STI's 12 have been created in the surface of substrate 10. This implant is an N+ implant creating regions 22 of N+ polarity. Since the capacitor that is to be created will be created above the surface of the STI's 12, this implant significantly reduces the parasitic capacitive coupling between the bottom plate of the capacitor and the substrate 10. The implant 20 decreases the thickness of the depletion region in the surface of the substrate 10 resulting in the indicated decrease in coupling between the substrate and the bottom plate of the capacitor. The implant 20 can be done with phosphorous or arson ions at a dosage of between about 4E14 and 2E15 atoms/cm$^2$ with an energy of between about 50 and 100 KeV.

Figure 3:
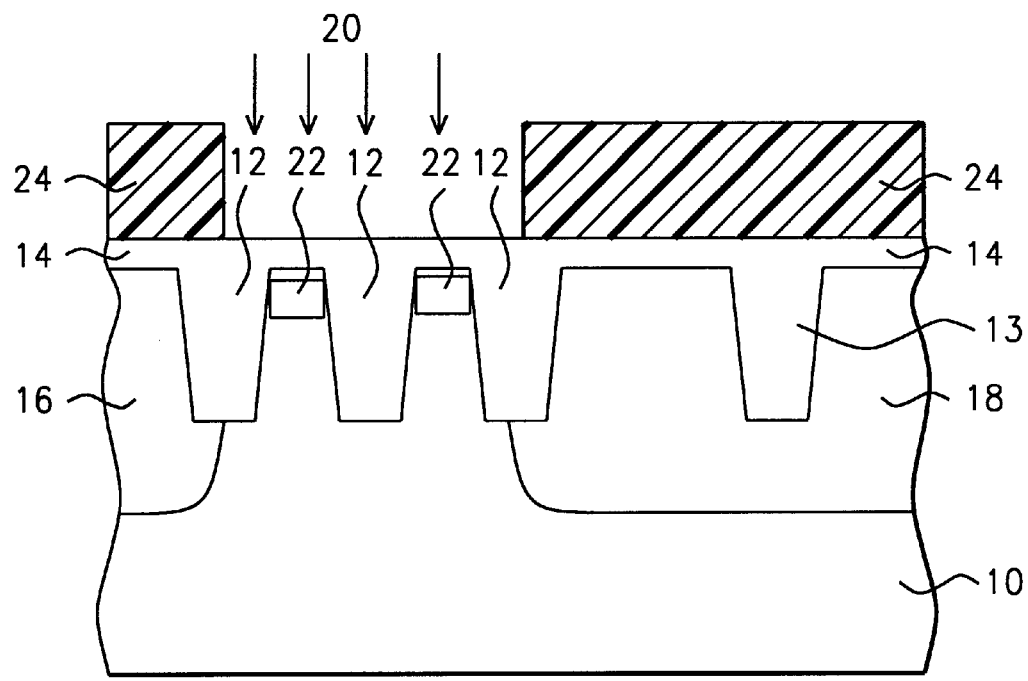
FIG. 3 shows a cross section after a layer of sacrificial oxide has been grown and the selective implant of dopants in the STI regions. N-well and P-well regions have also been created.

The next processing step that is shown in FIG. 3 is the creation of the N-well (16, FIG. 3) and P-well (18, FIG. 3) regions. For the creation of these regions 16 and 18, masking is applied as is well known in the art. For instance, for the N-well implant the surface of the substrate other than where the N-well implant is to be performed is shielded allowing implant ions to penetrate only in the to be created N-well regions of the substrate. A similar statement applies to the creation of the P-well.

N-well region 16 can typically be created using the following implant processing parameters:
N-well implant:
  P
    energy: 300 to 600 keV
    dose: 1e13 to 5e14 atoms/cm$^2$
  P
    energy: 50 to 300 keV
    dose: 1e12 to 5e13 atoms/cm$^2$
  As
    energy: 50 to 200 keV
    dose: 1e12 to 1e14 atoms/cm$^2$.

P-well region 18 can typically be created using the following implant processing parameters:
P-well implant:
  boron
    energy: 100 to 220 keV
    dose: 1e13 to 1e14 atoms/cm$^2$
  boron
    energy: 5 to 40 keV
    dose: 1e12 to 5e13 atoms/cm$^2$
  indium
    energy: 50 to 250 keV
    dose: 1e12 to 1e14 atoms/cm$^2$.

Figure 4:
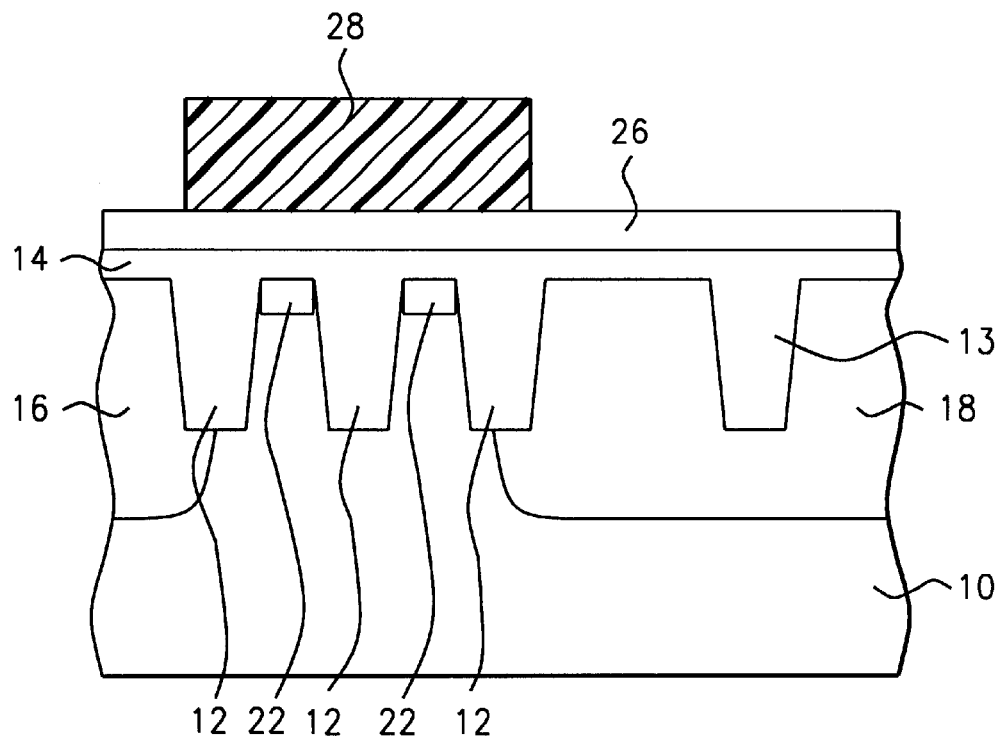
FIG. 4 shows a cross section after the deposition of an insulation layer of PSG or nitride with also showing a mask for patterning the capacitor bottom plate.

FIG. 4 shows a cross section after the deposition of a layer 26 of PSG or nitride, also shown is a (patterned) mask 28 of photoresist that is used for etching layer 26 thus forming a platform (26, FIG. 5) of PSG/nitride on which the capacitor will be created. Layer 26, which is blanket deposited over the surface of the sacrificial oxide, is essentially a barrier layer. A typical diffusion barrier layer may contain silicon nitride, phosphosilicate glass (PSG), silicon oxynitride, aluminum, aluminum oxide (AlxOy), tantalum, titanium nitride, nionbium, or molybdenum.

The preferred barrier layer of the invention is a layer of nitride, deposited using rf. sputtering, to a thickness between about 500 to 1000 Angstrom. Silicon nitride (Si$_3$Ni$_4$) can be deposited using LPCVD using a reactant gas mixture such as dichlorosilane (SiCl$_2$H$_2$) and amonia (NH$_3$), typically deposited to a thickness of between 700 and 1200 angstrom.

It must be noted that layer 26 decreases the parasitic capacitance of the device between the device components and the surface of the underlying substrate. A typical layer of Inter Poly Oxide (IPO) is of considerably thinner deposition and therefore causes considerably higher parasitic capacitance.

The layer 28 of photoresist has been deposited and etched in accordance with the dimensions of the bottom plate of the capacitor that is to be created. Photoresist layer 28 is typically deposited to a thickness of between 6000 and 10000 angstrom and is, after photolithographic exposure, removed by ashing in an 0$_2$ plasma. The dimensions of the remaining layer (26, FIG. 5) of nitride/PSG should be slightly larger than the dimensions of the bottom plate of the capacitor that is to be created overlying this layer. This to prevent overlapping of the bottom plate of the capacitor over the underlying layer of PSG/nitride.

Figure 5:
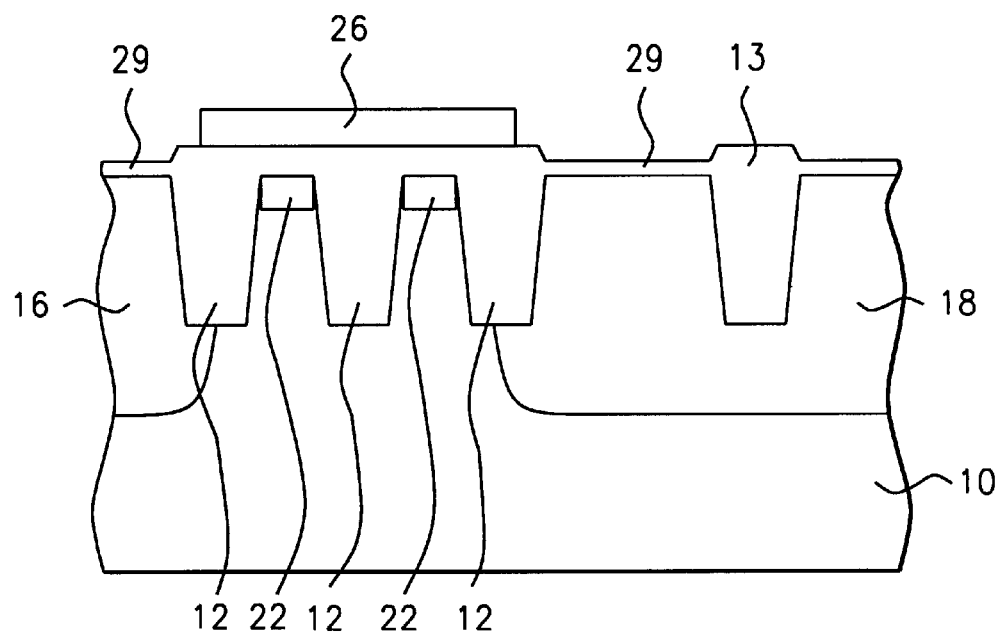
FIG. 5 shows a cross section after the completion of the etch of the insulation layer in accordance with the capacitor mask. The layer of sacrificial oxide has been stripped; a layer of gate oxide (not shown) has been grown over the surface of the substrate.

FIG. 5 shows a cross section after the completion of the etch of the layer 26 in accordance with the capacitor mask 28 (FIG. 4). The layer 26 of PSG/nitride can be anisotropically etched with a plasma gas containing carbon tetrafloride (CF$_4$) containing fluorine ions, in a commercial etcher such as a parallel plate RIE apparatus or an electron cyclotron resonance (ECR) plasma reactor.

Next, the layer 14 (FIG. 4) of sacrificial oxide is stripped and the gate oxide layer 29 is formed. It is known in the art that the photoresist (layer 28, FIG. 4) can be used as an etch protector when etching silicon, polysilicon, silicides, nitrides, oxynitrides, oxides, Al, Ti, Cu, W, Cr, TiN, TiW, GaAs, InP, PSG and BPSG. The layer 14 (FIG. 4) of sacrificial oxide can preferably be etched applying a buffer oxide etch (with a HF solution) or by an anisotropic dry etch. Layer 14 (FIG. 4) of sacrificial oxide can also be etched using Ar/CF$_4$ as an etchant at a temperature of between about 120 and 160 degrees C. and a pressure of between about 0.30 and 0.40 Torr for a time of between about 33 and 39 seconds using a dry etch process.

A layer of gate oxide (not shown in FIG. 5) is next formed by thermal oxidation of the underlying silicon (forming silicon dioxide) and can also be formed in conjunction with a deposited oxide layer, a composite oxide (such as TEOS), nitride layer or any other material suitable for use as a gate dielectric. Gate oxide is typically grown at a temperature of between about 700 and 900 degrees C. and to a thickness of between about 40 and 160 Angstrom.

The layer 26 of nitride forms the base for the bottom plate of the capacitor that is being created.

Figure 6:
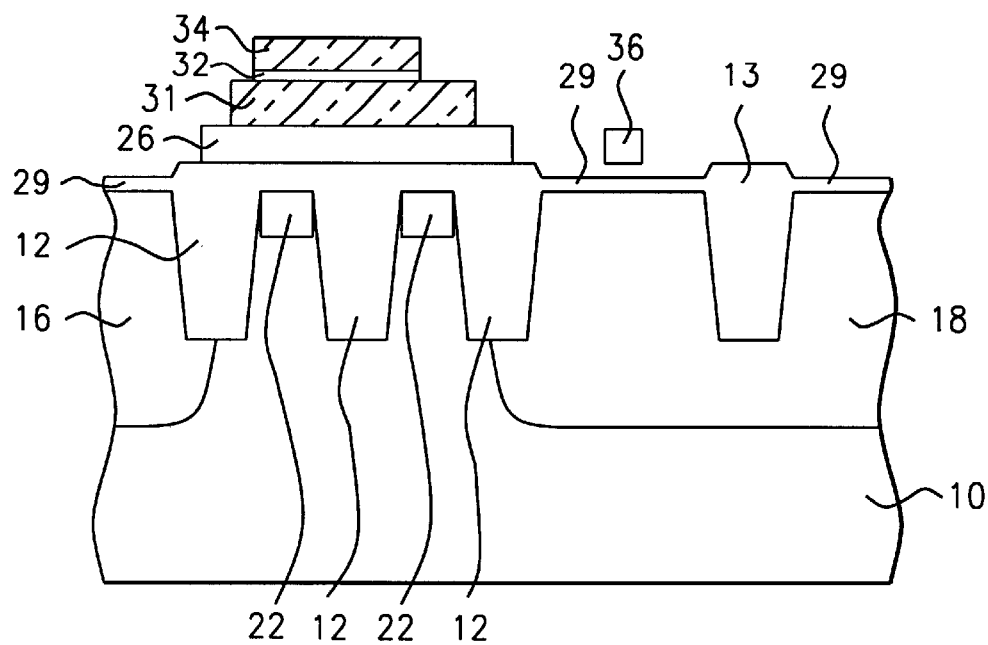
FIG. 6 shows a cross section after completion of the structure of the capacitor and a gate electrode.

FIG. 6 shows a cross section after completion of the structure of the capacitor and a gate electrode.

A layer 31 of poly 2 is deposited over the surface of capacitor base plate 26 and the surrounding layer of gate oxide (not shown). The poly 2 layer 31 is blanket deposited by using Low Pressure Chemical Vapor Deposition (LPCVD) at a temperature between about 500 and 700 degrees C. to a thickness between about 1000 ad 4000 Angstrom, and preferably between about 2000 and 3000 Angstrom. The poly 2 layer 31 is used to form the gate poly 36 and the bottom plate 31 of the capacitor.

An N+ implant is performed into layer 31 of poly 2, this implant forms the conductivity level of the NMOS poly gate 36 as well as the conductivity of the bottom plate of the capacitor. A mask is used that shields the surface of the layer 31 of poly 2 except for the region on the layer of poly 2 where the NMOS gate electrode and the capacitor bottom plate 31 are to be formed. During this implant, the NMOS region 36 and the layer 31 of poly 2 is doped with phosphorous ions at a dosage of between about 4E14 and 4E15 atoms/cm$^2$ with an energy of between about 50 and 100 KeV resulting in a N+ poly gate structure.

Layer 32 is next deposited, layer 32 contains TEOS and serves as the dielectric of the capacitor that is being formed. Layer 32 is a layer of LPCVD silicon dioxide using tetraethylorthosilicate (TEOS) as a source, deposited at a temperature between about 600 and 700 degrees C. to a thickness of between about 200 and 500 Angstrom.

Over the layer 32 of TEOS is deposited a layer 34 of poly 3. The poly 3 layer 34 is blanket deposited by using Low Pressure Chemical Vapor Deposition (LPCVD) at a temperature between about 500 and 700 degrees C. to a thickness between abut 1000 and 4000 Angstrom, and preferably between about 2000 and 3000 Angstrom. The poly 3 layer is used to form the top plate of the capacitor. The layer 34 of poly 3 is in-situ doped with phosphorous ions at a dosage of between about 2E15 and 6E15 atoms/cm$^2$. This is done in order to establish the desired level of conductivity of the top plate of the capacitor.

A capacitor mask (not shown) is used to expose (using conventional process of photolithography) and subsequently etch the layer 34 of poly 3 thereby forming the top plate 34 of the capacitor. Poly 3 layer 34 can be etched by exposing the layer to oxygen or oxygen-plasma at high temperatures (over 100 degrees C.). Polysilicon can also be etched using RIE or a high plasma density using an etchant gas having a high selectivity of poly to oxide, such as a gas containing clorine (Cl) species. Techniques are also known in the art whereby polysilicon can be etched using SF$_6$, SiO$_2$ and Si$_3$N$_4$ with a fluorocarbon.

An oxide dip is performed to remove the layer 32 of TEOS from the regions surrounding the bottom plate of the capacitor thereby forming the dielectric layer of the capacitor. The layer 32 can also be etched using a selective anisotropic dry etch whereby the layer of TEOS overlying the bottom plate of the capacitor is left in place. The oxide dip is performed by dipping the surface in a 200:1 diluted solution of hydrofluoric acid for the duration of 90 seconds.

The layer 31 of poly 2 can be etched using reactive ion, plasma or sputter etch techniques, it can also be etched using an anisotropic etch using a fluorine containing gas such as CHF$_3$ or CF$_4$.

Concurrent with the creation of the just highlighted capacitor structure, the N+ doped poly 2 gate electrode 36 has been formed from the deposited layer 31 of poly 2 using conventional processes of lithographic exposure followed by poly etching of the exposed poly gate pattern 36. The processing parameters for the etching of the poly gate electrode 36 are as indicated above for the etching of the bottom plate 31 of the capacitor, the gate electrode 36 is etched at the same time that the bottom plate 31 for the capacitor is etched.

Figure 7:
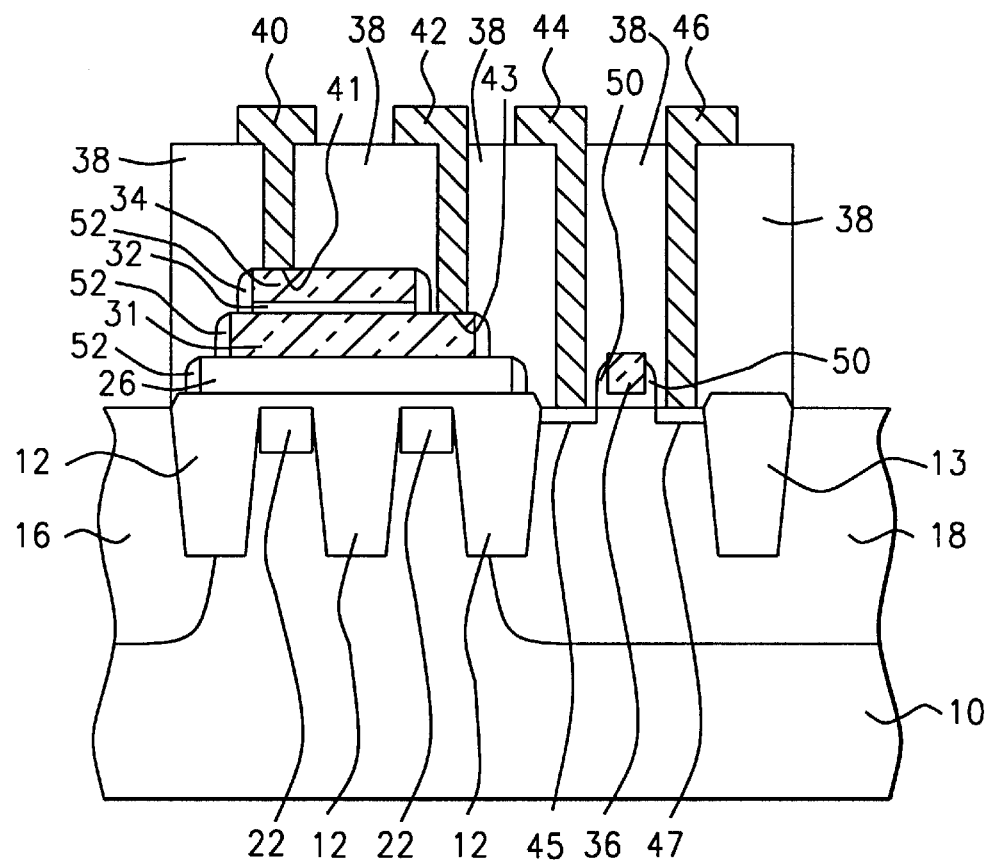
FIG. 7 shows a cross section after the deposition of a layer of Intra Level Dielectric (ILD) and the formation of metal electrical contacts.

FIG. 7 shows the "back-end" processing that is required to complete the structure of a FET and its adjacent capacitor.

Spacers are formed around the various structures, that is spacers 50 for the gate electrode and spacers 52 for the layer of the capacitor.

Typical gate spacer materials are silicon nitride, silicon oxide, BSG, PSG, polysilicon, other materials preferably of a dielectric nature and CVD oxide formed from a TEOS source. Often used are amorphous materials that inhibit the deposition of epitaxial silicon thereupon.

Forming a gate spacer comprises, for instance, the thermally growing, grown in an oxygen steam ambient at a temperature between about 850 and 1000 degrees C. and to a thickness of about 50 to 200 Angstrom, of a thin oxide on the sides of said gate electrode using a short dry-oxidation process whereupon a conformal CVD oxide film is deposited by decomposing TEOS at between 700 and 750 degrees C. followed by an anisotropic dry etch thereby leaving the gate spacers on the sidewalls of the gate electrodes.

Another method of forming gate spacers is by a process including a substantially conformal deposition of material that is selected from the group consisting of nitride, oxide, BSG, PSG and any combination thereof, and a subsequent, substantially anisotropic etch of this spacer material.

After the spacers have been formed, surfaces that are used to make electrical contact with the various points of the structure must be salicided. These surfaces are surface 41 on the top plate of the capacitor, surface 43 on the bottom plate of the capacitor, surface 45 on the source region of the NMOS gate electrode 36 and surface 47 on the drain region of the gate electrode. The salicide process refers to the creation of self-aligned (regions of) silicide. The layer of silicide is formed by the deposition of a layer of reactive metal, such as titanium or cobalt, over the surface where the layer of silicide needs to be formed. The reactive metal is annealed with the underlying silicon forming silicides such as TiSi$_2$ over the regions where low resistance electrical contact must be established.

After the process of salicidation, a layer of Intra Level Dielectric (ILD) 38 is deposited. Openings are created in this layer 38 of ILD to establish electrical contacts to the salicided surfaces of the structure. Materials that are typically used for ILD application are silicon dioxide (doped or undoped), silicon oxynitride, parylene or polyimide, spin-on-glass, plasma oxide or PECVD oxide. The layer 38 of ILD can be deposited using PECVD processing at a temperature between about 500 and 800 degrees C. and to a thickness between about 4000 and 10000 Angstrom.

After the layer of ILD has been deposited as indicated, contact openings are etched through the layer 38. Photolithographic and RIE procedures, using CHF$_3$ is an etchant, can be used to create the contact openings. A layer of metal is next rf sputter deposited filling the created openings for a metal contact 40 (to the top plate 34 of the created capacitor), 42 (to the bottom plate 31 of the created capacitor, 44 (to the source region 45 of the FET), and 46 (to the drain region 47 of the FET). This layer of metal (not shown in its entirety in FIG. 7) is patterned and etched to remove the metal between the various openings and to thereby break the interconnects between the metal contacts 40, 42, 44 and 46 and, as a final step, planarized using CMP techniques.

Not shown in FIG. 7 is the electrical point of contact that is typically also established with the surface of the gate electrode. It is clear that this contact can be established with methods and procedures that are identical to the methods and procedures that have been indicated for the formation of the points of electrical contact that have been discussed.

The following considerations further apply to the capacitor of the invention. In Prior Art capacitor design, a dummy area is created that covers about 40% of the total area. The dummy is hereby defined as the area over the surface of the STI regions and within the delineated active area of the substrate surface that is not used (taken up by) any components in that region. This dummy area has, during device operations, a dummy capacitance between the surface of the substrate and the bottom plate of the capacitor. The ratio of device capacitance to dummy (parasitic) capacitance is proportional to the area of the surface of the substrate that is taken up by these capacitances and inversely proportional to the dielectric thickness (layer 26) between the bottom plate of the capacitor and the surface of the substrate. By implementing the layer 26, we can achieve $C_{dev}:C_{par}=1:0.40/4=10$. This means that there is a loss of capacitive value for the main device capacitor of about 10%. This loss is recognized and can be compensated for by adjusting the design parameters for the device capacitance accordingly.

Also, for feature size in the region of about 0.35 µm, the process of the invention lends itself to the formation of double poly capacitors that are formed on the surface of the LOCOS region. This surface is for the indicated feature size planar enough for this application. This approach breaks down where the feature size is 0.25 µm or less. The capacitor size is relatively large, a large trench (STI trench) is therefore required, and a large trench typically suffers from severe dishing problems (downward sloping of the surface, starting at the edge of the trench and sloping toward the center of the trench). For this application, the invention provides significant improvements in the process of forming capacitors.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method to create a capacitor on the surface of Shallow Trench Isolation regions in the surface of a semiconductor substrate, comprising the steps of:

providing a semiconductor substrate;

creating Shallow Trench Isolation regions in the surface of said substrate;

depositing a layer of sacrificial oxide over the surface of said substrate;

creating regions of controlled ion concentrations within and immediately surrounding said Shallow Trench Isolation regions;

depositing an isolation layer over the surface of said layer of sacrificial oxide;

patterning and etching said isolation layer thereby forming a platform for said capacitor;

removing said layer of sacrificial oxide from the surface of said substrate in the area surrounding said platform;

forming a layer of gate oxide over the surface of said substrate thereby excluding the surface of said platform;

forming a capacitor structure over said platform thereby concurrently forming a gate electrode structure over said gate oxide; and completing establishing electrical points of contact with said capacitor and said gate electrode structure.

2. The method of claim 1 wherein said creating Shallow Trench Isolation regions in the surface of said substrate is:

creating a multiplicity of STI regions;

at least one subset of said multiplicity of STI regions contains closely spaced STI regions within the surface of said substrate whereby said subset of closely spaced STI regions serves as the base above which said capacitor will be created;

the total surface area of said closely spaced STI regions thereby including the areas of separation between these STI regions exceeds the surface area of the bottom plate of said capacitor by a measurable amount; and at least one STI region is separated along the surface of said substrate by an amount the allows for the creation of at least one gate electrode in this separation provided said one STI region forming a singulated STI region.

3. The method of claim 1 wherein said depositing a layer of sacrificial oxide on the surface of said substrate is using LPCVD, PECVD, or APCVD processing, in a steam oxygen ambient, at a temperature between about 400 to 800 degrees C. to a thickness between about 1000 to 3000 Angstrom.

4. The method of claim 1 wherein said creating regions of controlled ion concentrations within and immediately surrounding said Shallow Trench Isolation regions is:

creating an N-well region in the upper region of said substrate said N-well being immediately adjacent to said closely spaced STI regions;

creating an P-well region in the upper region of said substrate said P-well being immediately adjacent to said closely spaced STI regions;

said P-well region and said N-well region being at opposite ends of said closely spaced STI regions; and performing an N+ implant in surface of said closely spaced STI region thereby decreasing the depletion region in the region of said closely spaced SRI regions that is close to the surface of said substrate.

5. The method of claim 1 wherein said depositing an isolation layer over the surface of said layer of sacrificial oxide is depositing a layer of nitride or PSG deposited using rf. sputtering, to a thickness between about 500 to 1000 Angstrom.

6. The method of claim 1 wherein said patterning and etching said isolation layer thereby forming said platform for said capacitor is performing an anisotropically etch with a plasma gas containing carbon tetrafluoride (CF$_4$) containing fluorine ions, in a commercial etcher such as a parallel plate RIE apparatus or an electron cyclotron resonance (ECR) plasma reactor.

7. The method of claim 1 wherein said removing said layer of sacrificial oxide from the surface of said substrate in the area surrounding said platform is performing an etch using $Ar/CF_4$ as an etchant at a temperature of between about 120 and 160 degrees C. and a pressure of between about 0.30 and 0.40 Torr for a time of between about 33 and 39 seconds using a dry etch process.

8. The method of claim 1 wherein said forming a layer of gate oxide over the surface of said substrate thereby excluding the surface of said platform is forming a layer of gate oxide by thermal oxidation of the underlying silicon or in conjunction with a deposited oxide layer said gate oxide is grown at a temperature of between about 700 and 900 degrees C. and to a thickness of between about 40 and 160 Angstrom.

9. The method of claim 1 wherein said forming a capacitor structure over said platform thereby concurrently forming a gate electrode structure over said gate oxide is:
   depositing a layer of poly 2 over the surface of said platform thereby including the surface of said layer of gate oxide;
   masking and implanting N+ ions in said region of separation provided between said singulated STI region and said closely spaced STI regions;
   depositing a layer of dielectric over the surface of said layer of poly 2 thereby further curing said layer of dielectric;
   depositing a layer of in-situ doped poly 3 over the surface of said layer of dielectric;
   masking and etching said layer of poly 3 thereby creating the top plate of said capacitor;
   performing an oxide dip thereby effectively masking and etching said layer of dielectric thereby creating the dielectric interface of said capacitor; and
   masking and etching said layer of poly 2 thereby creating the bottom plate of said capacitor said bottom plate being aligned with said capacitor platform thereby furthermore creating said gate electrode said gate electrode being positioned in said region of separation provided between said singulated STI region and said closely spaced STI regions.

10. The method of claim 9 wherein said depositing a layer of poly 2 is a blanket deposition by using Low Pressure Chemical Vapor Deposition (LPCVD) at a temperature between about 500 and 700 degrees C. to a thickness between about 1000 ad 4000 Angstrom, and preferably between about 2000 and 3000 Angstrom.

11. The method of claim 9 wherein said implanting N+ ions in said region of separation provided between said singulated STI region and said closely spaced STI regions is an implant with phosphorous or arson ions at a dosage of between about 4E14 and 4E15 atoms/cm$^2$ with an energy of between about 50 and 100 KeV.

12. The method of claim 9 wherein said depositing a layer of dielectric over the surface of said layer of poly 2 contains tetraethylorthosilicate (TEOS) using LPCVD silicon as a source, deposited at a temperature between about 600 and 700 degrees C. to a thickness of between about 200 and 500 Angstrom.

13. The method of claim 9 wherein said depositing a layer of in-situ doped poly 3 is using Low Pressure Chemical Vapor Deposition (LPCVD) at a temperature between about 500 and 700 degrees C. to a thickness between abut 1000 and 4000 Angstrom, and preferably between about 2000 and 3000 Angstrom whereby said poly 3 is in-situ doped with phosphorous ions at a dosage of between about 2E15 and 6E15 atoms/cm$^2$.

14. The method of claim 9 wherein said masking and etching said layer of poly 3 is etching by exposing the layer of poly 3 to oxygen or oxygen-plasma at high temperatures (over 100 degrees C.) or by using RIE or a high plasma density etch thereby forming the top plate of said capacitor.

15. The method of claim 9 wherein said performing an oxide dip is exposing the layer of dielectric to oxygen or oxygen-plasma at high temperatures thereby forming the dielectric layer of said capacitor.

16. The method of claim 9 wherein said masking and etching said layer of poly 2 thereby creating the bottom plate of said capacitor thereby furthermore creating said gate electrode is exposing the layer of poly 2 to oxygen or oxygen-plasma at high temperatures (over 100 degrees C.) or by using RIE or a high plasma density etch.

17. The method of claim 1 with the additional steps of:
   forming layers of salicide on the surface of points of electrical contact;
   depositing a layer of Intra Level Dielectric (ILD) over the surface of the structure of the capacitor and said gate electrode thereby including said salicided surfaces thereby furthermore including the exposed surfaces of said substrate; creating openings in said layer of ILD said openings to align with said salicided surfaces;
   depositing a layer of metal over the surface of said layer of ILD thereby including said created openings;
   patterning and etching said layer of dielectric whereby said patterns at least aligns with said openings created in said layer of ILD.

18. The method of claim 17 wherein said contact surfaces include at least the source and drain regions and gate electrode surface of said gate electrode furthermore including the top and bottom plate of said capacitor.

19. The method of claim 1 wherein said forming layers of salicide on the surface of points of electrical contact is depositing a layer of reactive metal, such as titanium or cobalt, over said contact surfaces followed by a rapid thermal annealing in a temperature range of between 600 and 700 degrees C. for a time of between 20 and 40 seconds and then a rapid thermal annealing in a temperature of between about 800 and 900 degrees C. for a time between 20 and 40 seconds thereby forming silicides such as $TiSi_2$ over the regions where low resistance electrical contact must be established.

* * * * *

UNITED STATES PATENT AND TRADEMARK OFFICE
CERTIFICATE OF CORRECTION

PATENT NO. : 6,291,307 B1
DATED : September 18, 2001
INVENTOR(S) : Shao-Fu Sanford Chu, Yang Pan, Yimin Wang, Kai Shao It is certified that error appears in the above-identified patent and that said Letters Patent is hereby corrected as shown below:

Title page,
Item [75], delete "Wang Yimin" and replace with -- Yimin Wang --.

Signed and Sealed this

Second Day of April, 2002

Attest:

JAMES E. ROGAN
Attesting Officer
Director of the United States Patent and Trademark Office